United States Patent
Kim et al.

(10) Patent No.: US 8,108,741 B2
(45) Date of Patent: Jan. 31, 2012

(54) SEMICONDUCTOR MEMORY DEVICE HAVING MOUNT TEST CIRCUITS AND MOUNT TEST METHOD THEREOF

(75) Inventors: Byoung-Sul Kim, Suwon-si (KR);
Joon-Hee Lee, Yongin-si (KR);
Kwan-Yong Jin, Suwon-si (KR);
Seung-Hee Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 753 days.

(21) Appl. No.: 12/219,815

(22) Filed: Jul. 29, 2008

(65) Prior Publication Data

US 2009/0037784 A1    Feb. 5, 2009

(30) Foreign Application Priority Data

Jul. 30, 2007   (KR) .................. 10-2007-0076383

(51) Int. Cl.
*G11C 29/00* (2006.01)
*G11C 7/00* (2006.01)
(52) U.S. Cl. .................. 714/719; 714/718; 365/201
(58) Field of Classification Search .................. None
See application file for complete search history.

(56) References Cited

U.S. PATENT DOCUMENTS

| 5,764,878 | A | * | 6/1998 | Kablanian et al. | 714/6.11 |
| 6,317,373 | B1 | | 11/2001 | Tanimura | |
| 6,668,345 | B1 | * | 12/2003 | Ooishi et al. | 714/710 |
| 7,246,280 | B2 | * | 7/2007 | Kim et al. | 714/719 |
| 2005/0216809 | A1 | * | 9/2005 | Kim et al. | 714/738 |

FOREIGN PATENT DOCUMENTS

| JP | 05-307900 | 11/1993 |
| KR | 2004-0070919 | 8/2004 |

* cited by examiner

*Primary Examiner* — Jeffrey A Gaffin
*Assistant Examiner* — Guerrier Merant
(74) *Attorney, Agent, or Firm* — Harness, Dickey & Pierce, P.L.C.

(57) ABSTRACT

A semiconductor memory device having a mount test circuit and a mount test method thereof are provided. The test circuit for use in a semiconductor memory device including a plurality of memory blocks may include a comparison unit for comparing test data of at least two memory blocks selected from the plurality of memory blocks, deciding whether or not the test data of the selected memory blocks are identical, and outputting a pass signal or fail signal as a flag signal; and an output selection unit for selecting any one of the selected memory blocks as an output memory block, and changing the output memory block whenever the fail signal is generated from the comparison unit, thus forming it as a data output path, which may lessen error occurrence.

18 Claims, 8 Drawing Sheets

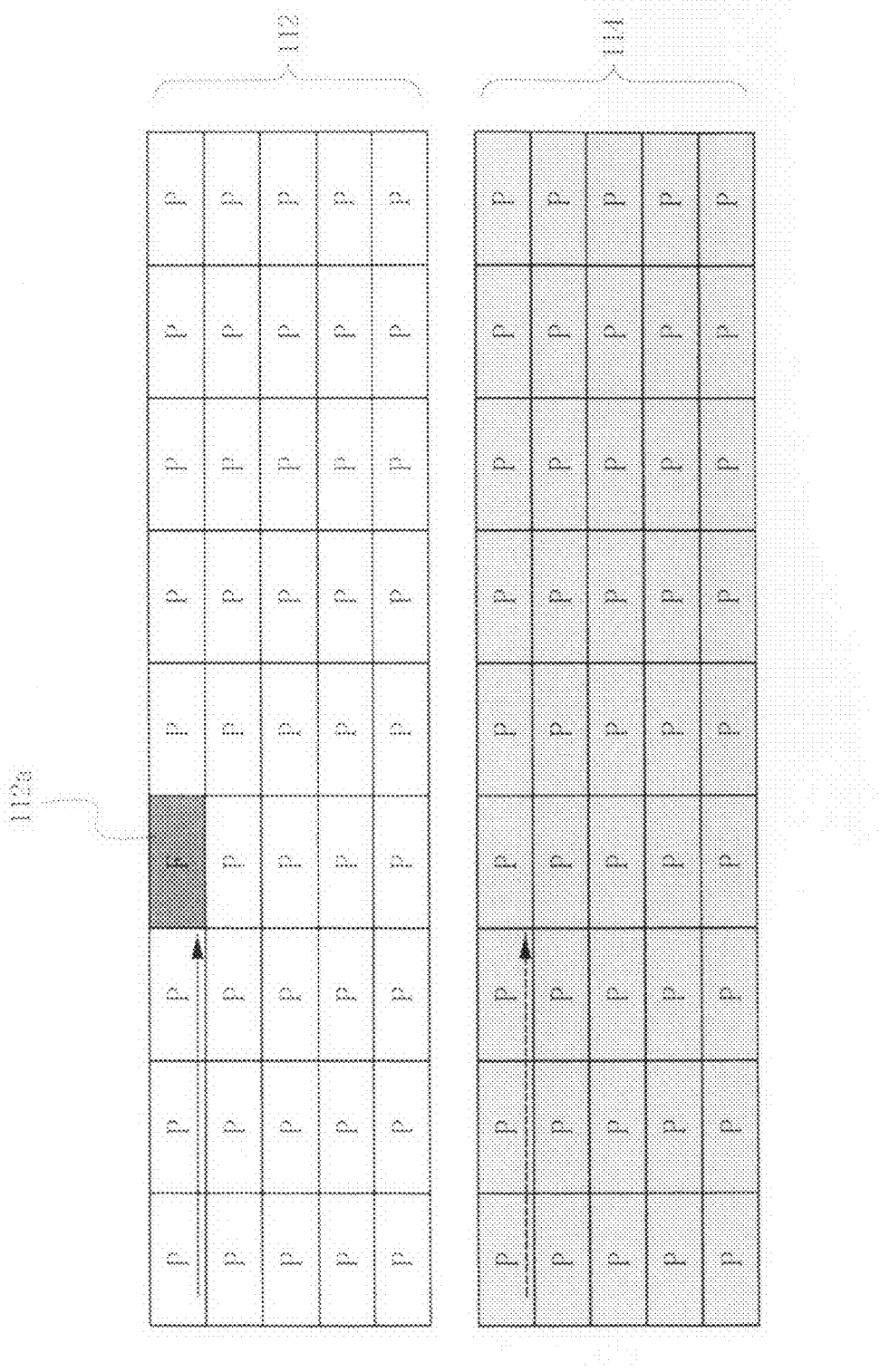

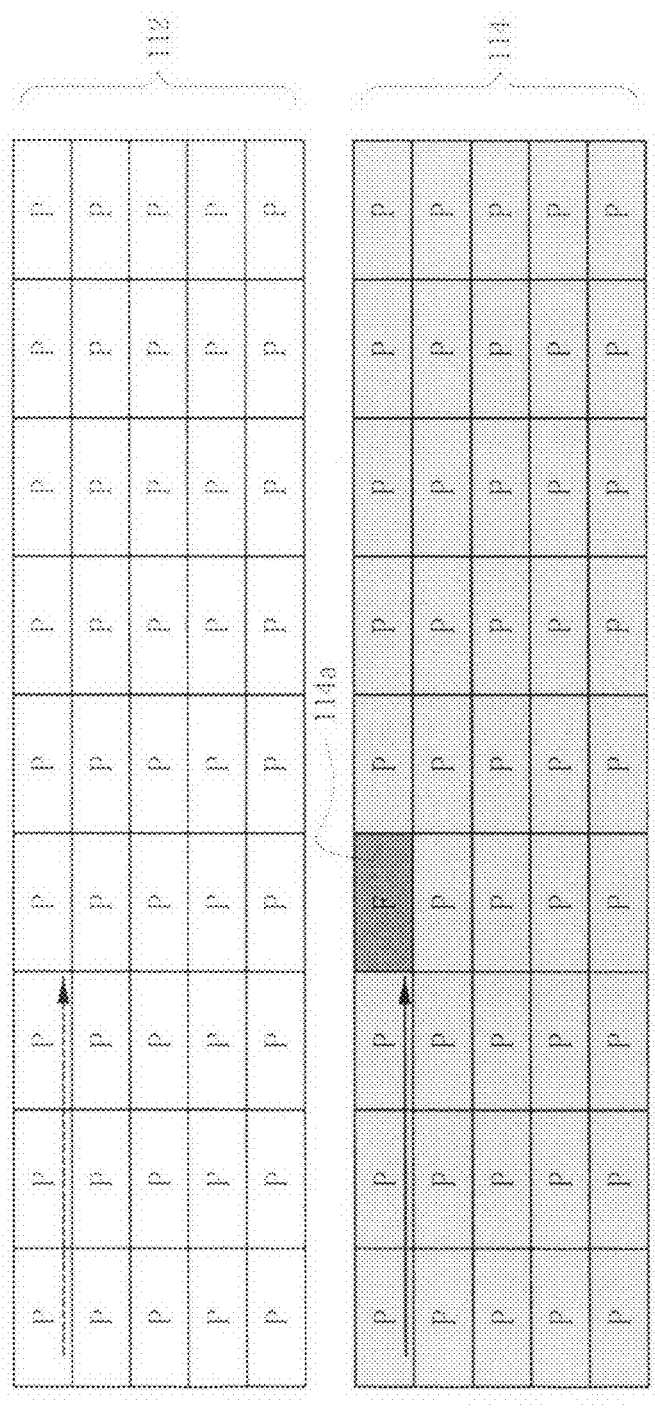

SEMICONDUCTOR MEMORY DEVICE HAVING MOUNT TEST CIRCUITS AND MOUNT TEST METHOD THEREOF

PRIORITY STATEMENT

This application claims priority under 35 U.S.C. §119 to Korean Patent Application No. 10-2007-0076383, filed on Jul. 30, 2007, in the Korean Intellectual Property Office (KIPO), the entire contents of which are incorporated herein by reference.

BACKGROUND

1. Field

Example embodiments relate to the test of semiconductor memory devices, and more particularly, to a semiconductor memory device including a mount test circuit that may be capable of reducing a test time, and a mount test method thereof.

2. Description of Related Art

In semiconductor memory devices, for example DRAM, there may be a need for read and write operations of data to be precise. There may be a need to have a reduced number of defective cells on a chip. However, semiconductor devices may be highly integrated. Consequently, the number of memory cells integrated in one chip may increase. Thus, despite the development of semiconductor device manufacturing processes, the likelihood of defective cell occurrence within the chip may increase. Unless a precise test for these defective cells is performed, it may be difficult to achieve an acceptable level of reliability with semiconductor memory devices.

In a test operation of semiconductor memory devices, for example, when the test per memory cell should be performed in a highly integrated semiconductor memory device, a test time may be lengthened and cost may increase. In order to lessen the test time for semiconductor memory device, many devices and methods are under development. A parallel bit test method may be used to reduce the test time.

The parallel bit test method may employ an XOR (exclusive OR) or XNOR (exclusive NOR) logic circuit. For example, the same data may be written to a plurality of memory cells, and then in a read operation for the data, a logical operation may be performed through an XOR or XNOR logical circuit. At this time, when data of the same logic state is read, a decision of pass may be given, and when data having even one different logic state is read, it may be regarded as a failure in the test.

Tests of semiconductor memory devices like those described above may have been performed only on devices in a wafer state or package state. However, the test may be required even when the semiconductor memory devices may be mounted on a PCB (printed circuit board) as a memory module. In a test of such a real system (hereinafter, referred to as 'mount test'), it may be impossible to perform the test by the same method as the conventional wafer state or package state since the semiconductor memory devices may be operating.

In particular, when the mount test employing the parallel bit test method is performed, problems may occur. In other words, the mount test for the semiconductor memory devices may be performed at a normal speed and a fail signal, which may be generated through a data comparison, may be passed through a logic circuit such as XOR etc., and may produce a delay. Thus, it may be difficult to properly process the fail signal in real time. As a possible solution to the problem, a fail signal processing method which may generate subsequent data as a high impedance (Hi-Z) in the case of fail occurrence has been introduced. That is, in the fail occurrence, a fail processing operation may be performed through a floating of a data output path. This is described referring to FIG. 1, as follows.

FIG. 1 illustrates a test circuit for a mount test according to a conventional art.

As shown in FIG. 1, in a conventional mount test circuit, two memory blocks, 12 and 14, may be selected from a memory array 10, which may have a plurality of memory blocks, and may be tested simultaneously. For the test, a comparison unit 20 and a fail processing unit 30 may be used. Additionally, data may be written to the two memory blocks 12 and 14 simultaneously.

The comparison unit 20 may compare data AD0~AD3 of the first memory block 12 with data BD0~BD3 of the second memory block 14, and may decide whether a fail occurs. The comparison unit 20 may have the same configuration as a comparator of general parallel test circuit. For example, whether or not the data AD0~AD3 and the data BD0~BD3 are identical may be determined by employing a plurality of XOR logic circuits 22, 23, 24 and 25 and an OR logic circuit 26 in the comparison unit. The comparison unit 20 may generate a pass signal as a decision signal DS when the data is identical, and the comparison unit 20 may generate a fail signal as a decision signal DS when the data is not identical.

The fail processing unit 30 may output data BD0~BD3 of one predetermined memory area, i.e., second memory area, to the outside through an output buffer (not shown) when a pass signal is applied from the comparison unit 20. When the fail signal is applied from the comparison unit 20, output data outputted subsequently may be set to a state of high impedance HZ. In other words, a data output path through which the output data is outputted may become floating. Here, the high impedance state may indicate neither a logic state of data 0 nor a logic state of data 1. However, such conventional mount test technology may cause several problems in an actual system. As an example, a read operation may be generated in a specific area where a write operation for the test has not been performed. Thus, even though a fail has not actually occurred, a fail signal may generated. Such problem may be caused when a cache memory has been used or a system area has been contained therein, etc. For example, when the cache memory is used, a write operation may be performed to fill a cache line and unknown data of area may be read by an initial dummy read operation, etc., thus causing a fail. Furthermore, in a system area such as an operating system etc., unknown read data may be used as test data by the dummy read operation of the system area etc. and a fail may be caused. Thus, it may be difficult to perform the normal test.

SUMMARY

Example embodiments may provide a semiconductor memory device having a mount test circuit and a mount test method thereof. Test error and test time may be reduced, with a precise test.

According to example embodiments, a test circuit for use in a semiconductor memory device including a plurality of memory blocks may comprise a comparison unit for comparing test data of at least two memory blocks selected from the plurality of memory blocks, deciding whether or not the test data of the two memory blocks is identical, and outputting a pass signal or fail signal as a flag signal; and an output selection unit for selecting any one of the selected memory blocks as an output memory block, and changing the output memory block whenever the fail signal is generated from the comparison unit, thus choosing the test data of the output memory block to be output through a data output path.

The output selection unit may maintain the output memory block intact without changing when a pass signal is applied from the comparison unit, thus the data of the output memory block may be output through a data output path. The semiconductor memory device may comprise at least one first-memory block and second-memory block provided as a memory area different from a first memory area. The comparison unit may compare first data as test data of the first memory block with second data as test data of the second memory block, may generate a pass signal when the first and second data are identical, and may generate a fail signal when the first and second data are different from each other. The comparison unit may comprise at least one XOR logic circuit.

In choosing the data to output through the data output path that may have any one of the first and second data as output data, the output selection unit may alternately select the output data from the first and second data whenever the fail signal is generated in the comparison unit. The semiconductor memory device may constitute a memory module in a state mounted on a PCB.

The test circuit may further comprise a selection signal generating unit for generating a selection signal to select the output memory block through the output selection unit and constitute the data output path. The selection signal generating unit may generate a selection signal to change the data output path in response to the fail signal and a subsequent active signal of the comparison unit.

According to example embodiments, a semiconductor memory device may comprise a memory cell array having at least first and second memory blocks that may be different from each other; a comparison unit for deciding whether first data as test data of the first memory block is identical to second data as test data of the second memory block, and outputting a pass signal or fail signal as a flag signal; and an output selection unit for alternately selecting an output memory block whenever a pass signal is generated in the comparison unit, thus outputting the data of the output memory block through the data output path, the output memory block being chosen from the first and second memory blocks.

The comparison unit and the output selection unit may constitute a test circuit for testing the semiconductor memory which may be mounted on a memory module. The semiconductor memory device may further comprise a selection signal generating unit for generating a selection signal to select the output memory block through the output selection unit thus setting that data of the output memory block as the data which will be output through the data output path. The selection signal generating unit may generate a selection signal to alternately select the output memory block in response to a fail signal and a subsequent active signal of the comparison unit.

According to example embodiments, a test method of a semiconductor memory device including a plurality of memory blocks may comprise selecting at least two memory blocks from the memory blocks, comparing test data of the selected memory blocks, deciding whether or not the test data of the two or more memory blocks are identical, and outputting a pass signal or fail signal as a flag signal; and choosing to output through the a data output path for outputting test data the data of an output memory block from among the selected memory blocks, in a way that an output memory block may be maintained if a pass signal is generated and the output memory block of the test data may be changed if a fail signal is generated.

The pass signal may be generated when test data of selected memory blocks are identical to each other, and the fail signal may be generated when the test data are not identical to each other. The output memory block which outputs data through the data output path may be chosen in response to a selection signal which may be generated in response to the fail signal.

The selection signal may be generated at a time point when a subsequent active signal is generated, and the test method may be performed in a state that the semiconductor memory device constituting a memory module is mounted on a PCB.

According to example embodiments, a mount test method for use in a semiconductor memory device may comprise selecting different output memory blocks according to an identification state between test data of previously selected memory blocks, and outputting test data.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

Example embodiments will become more fully understood from the detailed description given hereinbelow and the accompanying drawings which are given by way of illustration only, and thus are not limitative of example embodiments, and wherein:

FIGS. 6 to 8 illustrate tables for test operation of FIGS. 2 through 5 according to example embodiments.

DESCRIPTION OF EXAMPLE EMBODIMENTS

Figure 1:
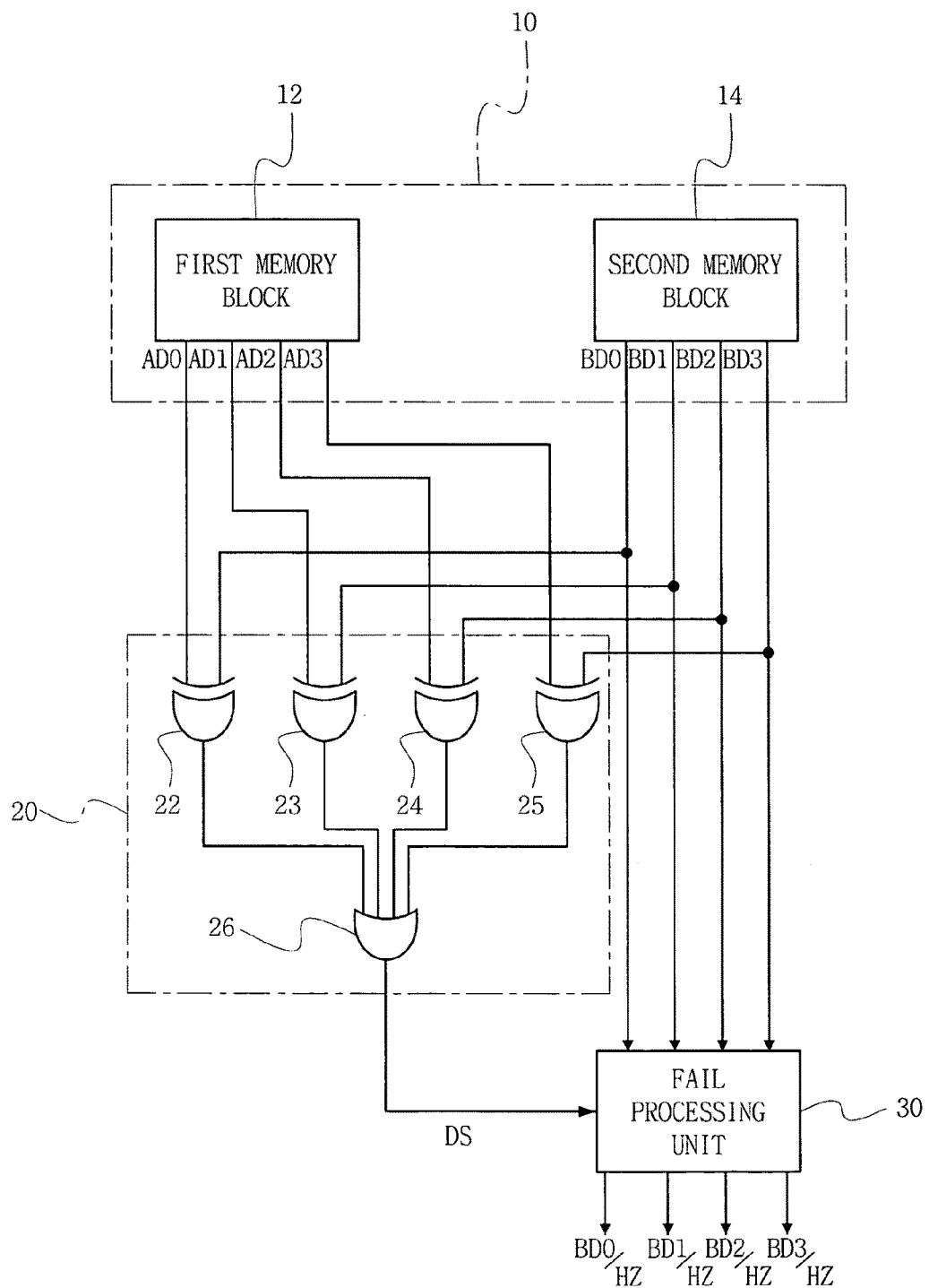
FIG. 1 is a block diagram of semiconductor memory device including a mount test circuit according to conventional art.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is no intended to be limited of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms used herein should be interpreted as having a meaning that is consistent with their meaning in the context of this specification and the relevant art and will not be interpreted in an idealized or overly formal sense unless expressly so defined herein. Example embodiments are more fully described below with reference to FIGS. 2 to 8. Example embodiments, however, may be embodied in many different forms and should not be construed as being limited to example embodiments set forth herein; rather, these example embodiments are provided so that this disclosure is thorough and complete, and conveys the concepts of example embodiments to those skilled in the art.

Figure 2:
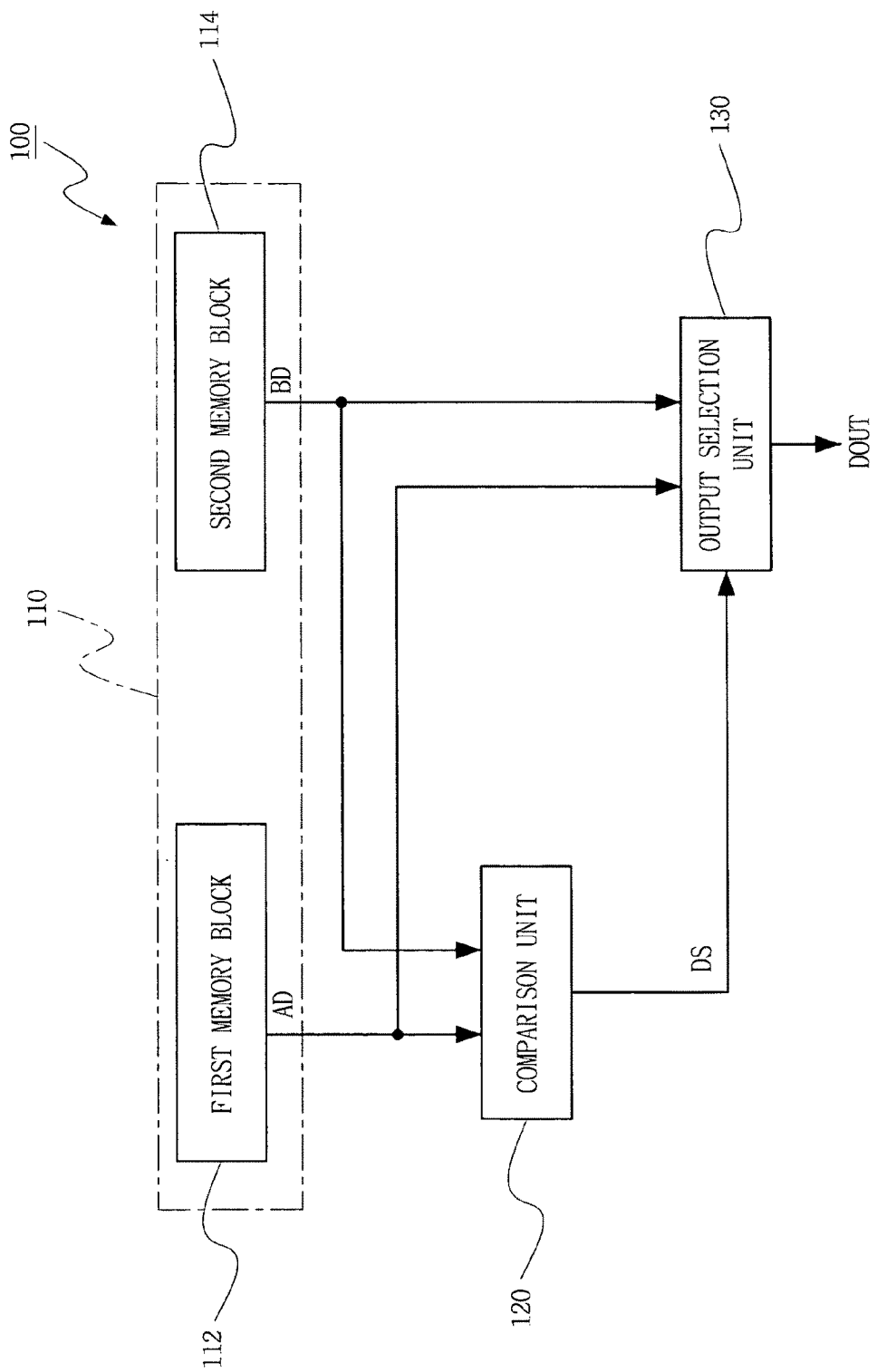
FIGS. 2 and 3 are block diagrams of a semiconductor memory device including a test circuit according to example embodiments.

FIG. 2 is a block diagram of a semiconductor memory device including a test circuit according to example embodiments.

As shown in FIG. 2, a semiconductor memory device 100 according to example embodiments may comprise a memory array 110 and a test circuit 120, 130. The test circuit may comprise a comparison unit 120 and an output selection unit 130.

The memory array 110 may comprise a first memory block 112 and a second memory block 114 as two different memory areas. A memory area, for example, may be a section of memory array 110. The memory array 110 may comprise a plurality of memory banks, and each memory bank may comprise a plurality of memory blocks. Though memory array 110 may have many blocks, only the first and second memory blocks 112 and 114 are shown in the drawings.

The comparison unit 120 may select at least two memory blocks, i.e., first and second memory blocks 112 and 114, from the plurality of memory blocks, compare test data of the selected memory blocks 112 and 114, decide whether or not the test data of the selected memory blocks are identical, and then output a pass signal P or fail signal F as a flag signal DS.

The output selection unit 130 may select any one of the selected memory blocks as an output memory block, thus choosing the data of the selected memory block to be output through a data output path. Whenever the fail signal F is generated in the comparison unit 120, the output memory block may be changed, thus choosing the data of a new memory block to be output through the data output path.

For example, when test for first and second memory blocks among the memory blocks is performed and the first memory block may be selected as an output memory block by default. When fail signal F is generated in the comparison unit 120, the output memory block may be changed to a second memory block, making the second memory block the output memory block. Meanwhile, when a pass signal is applied from the comparison unit 120, the output memory block may be maintained intact without changing.

Data of a memory block selected as the output memory block may be output through the data output path of the output selection unit 130. Data DOUT output from the output selection unit 130 may be output to an input/output pad or input/output pin DQ through an output buffer (not shown) of a general semiconductor memory device.

The output selection unit 130 may choose which data to output through the data output path by using a multiplexer. Further, as another example, a specific output buffer corresponding to each memory block may be used, and an output buffer corresponding to each memory block may be selected, thereby choosing the data of the selected memory block to be output through data output path.

Figure 3:
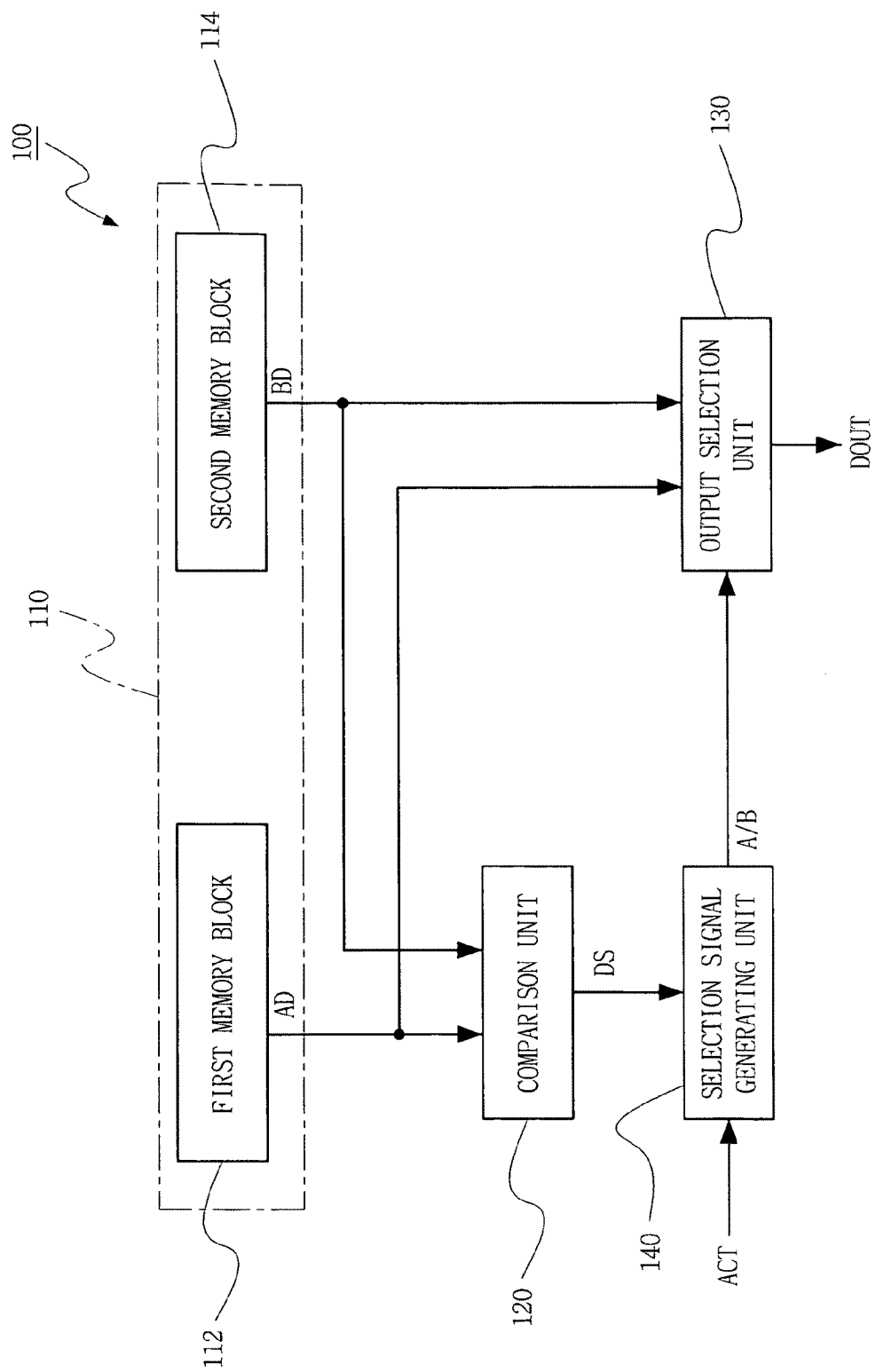

FIG. 3 is a block diagram of semiconductor memory device which may have the same configuration as the device in FIG. 2 with the addition of a selection signal generating unit 140. Accordingly, only the added selection signal generating unit 140 is described as follows.

The selection signal generating unit 140 may generate a selection signal A/B to select the output memory block. The selection signal generating unit 140 may change the data output path whenever a fail signal F is generated in the comparison unit 120. In FIG. 2, the fail signal F may be input directly to the output selection unit 130 to control the output selection unit 130, but in FIG. 3 the selection signal A/B may be input to the output selection unit 130.

For example, when first memory block 112 is an output memory block, and when fail signal F is generated, a selection signal B to change the output memory block to second memory block 114 may be generated. Further, when the second memory block 114 has been selected as the output memory block, and when fail signal F is generated in the comparison unit 120, a selection signal A to change the output memory block to the first memory block 112 may be generated. In addition, when the fail signal F is generated and the output memory block is changed from the second memory block 114 to the first memory block 112, and then, when fail signal F is again generated; selection signal B to change the output memory block from the first memory block 112 to the second memory block 114 may be generated.

Though the process of selecting a memory block as an output memory block was described for two blocks, first and second memory blocks 112 and 114 in the example above, the process may also be used to sequentially change the output memory block even when there are three or more memory blocks being tested.

The selection signal generating unit 140 may generate the selection signal A/B in response to not only the fail signal F of the comparison unit 120 but a subsequent active signal ACT applied subsequently after a generation of the fail signal F.

The selection signal A/B may be delayed until the subsequent active signal ACT is generated.

In the following description, examples for the configuration and operation of two selected memory blocks, i.e., first and second memory blocks 112 and 114, are provided. According to example embodiments, two memory blocks may be tested simultaneously. Additionally, three or more memory blocks may be selected and tested simultaneously. As an example, a data capacity of 4 bits may be tested simultaneously. Thus, the generation of one pass or fail signal may indicate that a test for 4 bit data has been performed.

Figure 4:
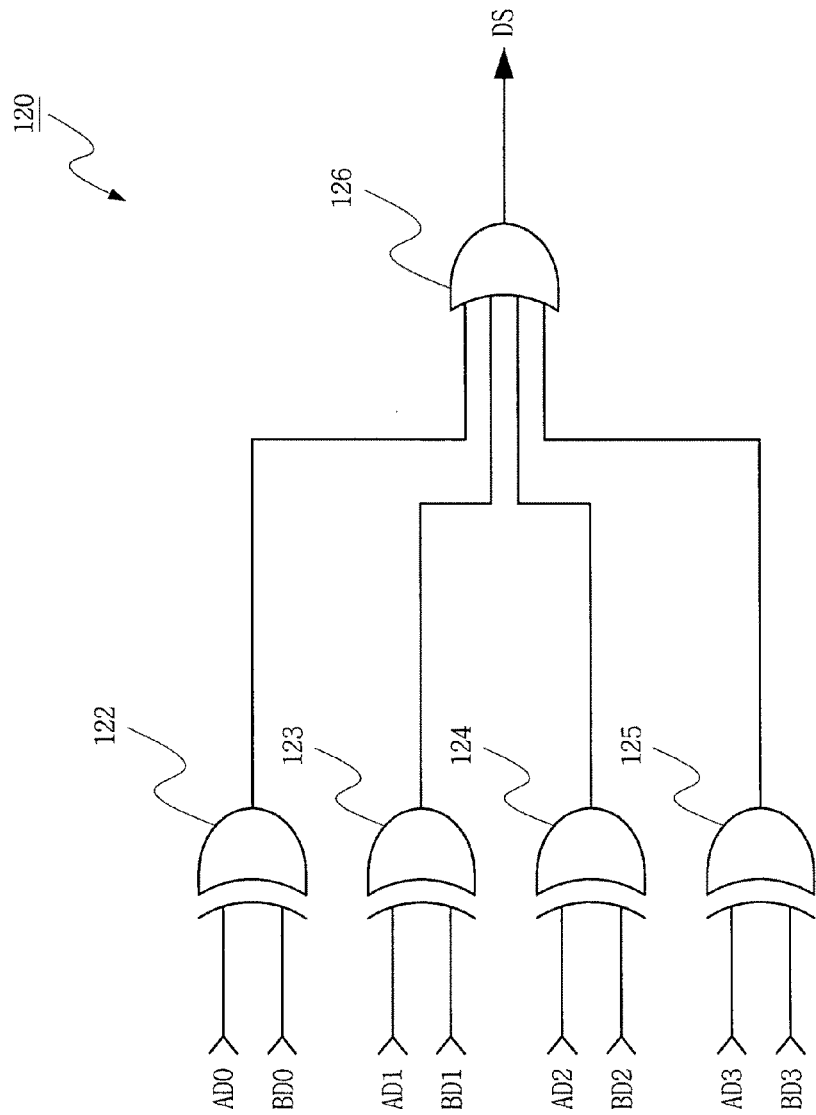
FIG. 4 is a circuit diagram illustrating the comparison unit referred to in FIGS. 2 and 3 according to example embodiments.

FIG. 4 is a circuit diagram illustrating an embodiment of comparison unit 120 referred to FIGS. 2 and 3.

As shown in FIG. 4, the comparison unit 120 may comprise XOR logic circuits 122, 123, 124 and 125, and an OR logic circuit 126.

The XOR logic circuits 122, 123, 124 and 125 may compare data AD0, AD1, AD2 and AD3 of first memory block 112 with data BD0, BD1, BD2 and BD3 of second memory block 114, and may decide whether or not the data are identical to one another.

For example, when no error exists, data 'AD0 and BD0' may have the same logic state, and data 'AD1 and BD1', 'AD2 and BD2' and 'AD3 and BD3' may have the same logic state. Thus, in providing 'AD0 and BD0' as an input of the XOR logic circuit; when the mutual logic state is identical, a 'low' level may be output, and when the mutual logic state is different, a 'high' level may be output. In such method, data AD0, AD1, AD2 and AD3 of first memory block 112 may be compared with data BD0, BD1, BD2 and BD3 of second memory block, and whether or not the two sets of data are identical may be determined. According to example embodiments, when even one of the output signals from the XOR logic circuits 122, 123, 124 and 125 has a 'high' level, the flag signal DS as an output of the comparison unit 120 may become a fail signal F. When all of the output signals of the XOR logic circuits 122, 123, 124 and 125 have a 'low' level, the flag signal DS as an output of the comparison unit 120 may become a pass signal P.

The generation of a fail signal F may indicate that at least one of the memory cells where data AD0, AD1, AD2 and AD3 of the first memory block 112 and data BD0, BD1, BD2 and BD3 of the second memory block 114 are stored, has an error. However, according to example embodiments, the fail signal may not be represented externally. Thus it may be impossible to determine that a fail occurred through the fail signal. Therefore, an output memory block may be changed by the output selection unit 130, thereby recognizing that at least one of two memory blocks 112 and 114 has the fail occurrence.

The comparison unit 120 may be configured diversely, including XOR logic circuits, XNOR logic circuits, AND logic circuits and OR logic circuits. The comparison unit 120 may include a plurality of various logic circuits for various methods. Further, comparison unit 120 may be realized through comparison circuits already well-known to those skilled in the art.

Figure 5:
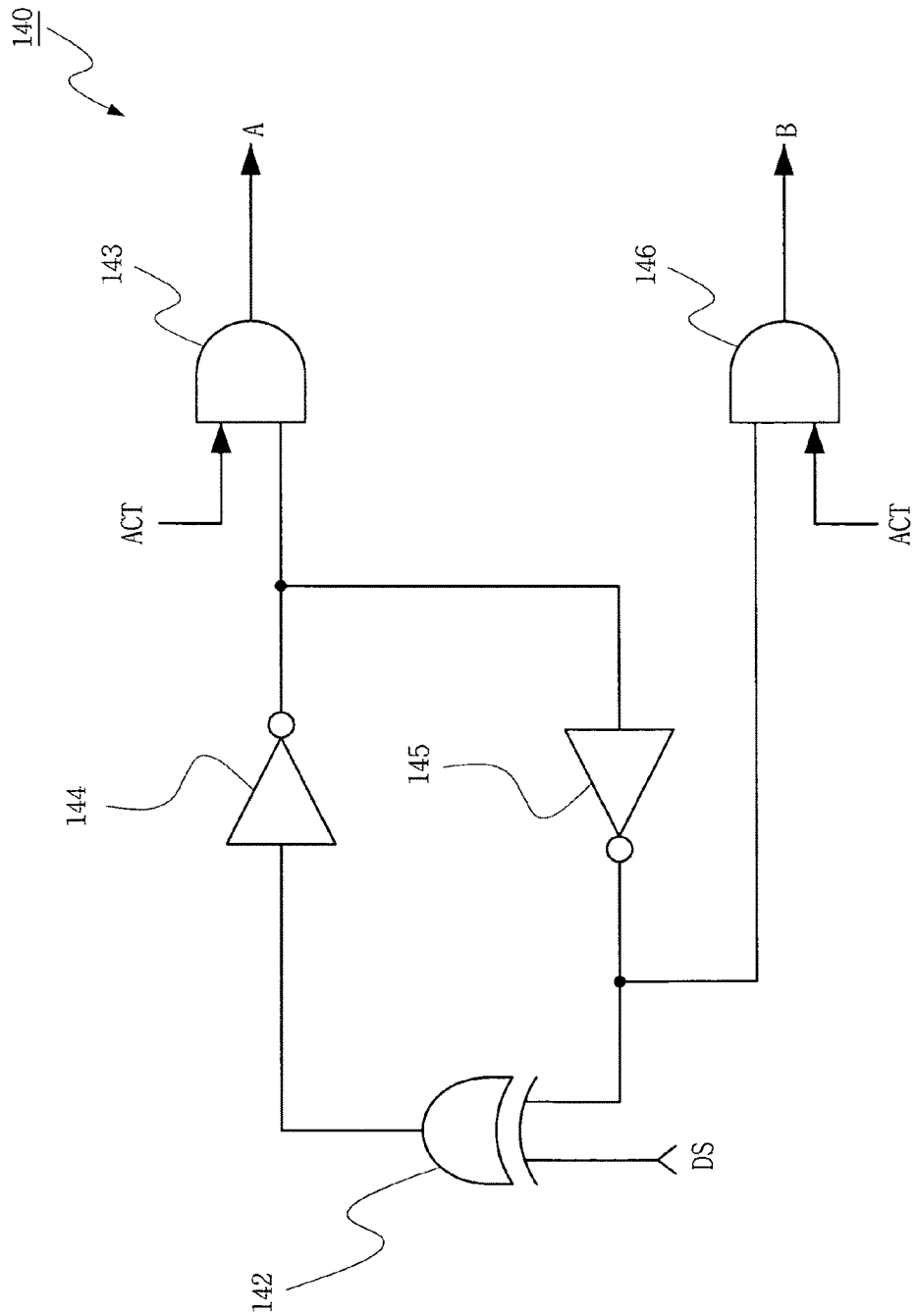
FIG. 5 is a circuit diagram illustrating the selection signal generating unit shown in FIG. 3 according to example embodiments.

FIG. 5 illustrates the selection signal generating unit shown in FIG. 3 according to example embodiments.

The selection signal generating unit 140 may comprise an XOR logic circuit 142, inverters 144 and 145 and AND logic circuits 143 and 146, and may have the wiring structure shown in FIG. 5.

Referring to FIG. 5, a loop may be formed including an XOR logic circuit 142 having, as an input, the flag signal DS which may be applied from the comparison unit 120 and an output of an inverter 145; an inverter 144 which may have as an input an output of the XOR logic circuit 142; and the inverter 145 which may have as an input the an output of the inverter 144. While the flag signal DS applied from the comparison unit 120 is a pass signal, an output state of the inverters 144 and 145 may not change, and an original logic state may be maintained. However, when the flag signal DS applied from the comparison unit 120 is a fail signal, outputs of the inverters 144 and 145 may be changed to mutually opposite states.

For example, if an output of the inverter 144 has a 'high' state as an initial value, an output of the inverter 145 has a 'low' state, and the flag signal DS has an applied state of pass signal, i.e., 'low' state, then an output of the XOR logic circuit 142 may become a 'low' state. When the flag signal DS is changed to a 'high' state, or a fail signal is applied, then the output of the XOR logic circuit 142 may be changed to a 'high' state, an output of the inverter 144 may be changed to a 'low' state, and an output of the inverter 145 may be changed to a 'high' state.

As another example, if an output of the inverter 144 has a 'low' state as an initial value, an output of the inverter 145 has a 'high' state, and the flag signal DS has an applied state of pass signal, i.e., 'low' state, then an output of the XOR logic circuit 142 may become a 'high' state. When the flag signal DS is changed to a 'high' state, or a fail signal is applied; the output of the XOR logic circuit 142 may be changed to a 'low' state. Then an output of the inverter 144 may be changed to a 'high' state and an output of the inverter 145 to a 'low' state.

An output of the inverter 144 may become an input of AND circuit 143, and an output of the inverter 145 may become an input of AND circuit 146. The AND circuits 143 and 146 may have active signal ACT as each second input. When the active signal has a 'high' level, the AND circuits may output the output of the inverter 144 and the inverter 145. Then, when the active signal has a 'high' state, and when the output of the inverter 144 is a 'high' level, a selection signal A may be generated. Additionally, when the output of the inverter 145 has a 'high' state, a selection signal B may be generated. The active signal ACT may be applied as an active signal which may be initially applied after the generation of a fail signal.

According to example embodiments, a fail signal generated in the comparison unit 120 may cause a selection signal to be generated to select an output memory block. Thus, the problems such as a loss of effective data or a speed limit, which may be caused by the high impedance state which may be used in a conventional test method, may be solved. For example, according to example embodiments, generating a selection signal may take less time than generating a high impedance output. Further, according to example embodiments, even in the event of a fail signal, actual data read from a memory block being tested may be output instead of a high impedance output, and may be used in a testing operation instead of being lost. Additionally, the problem where fail signal may be generated even though a fail does not actually occur may be solved.

Figure 6:
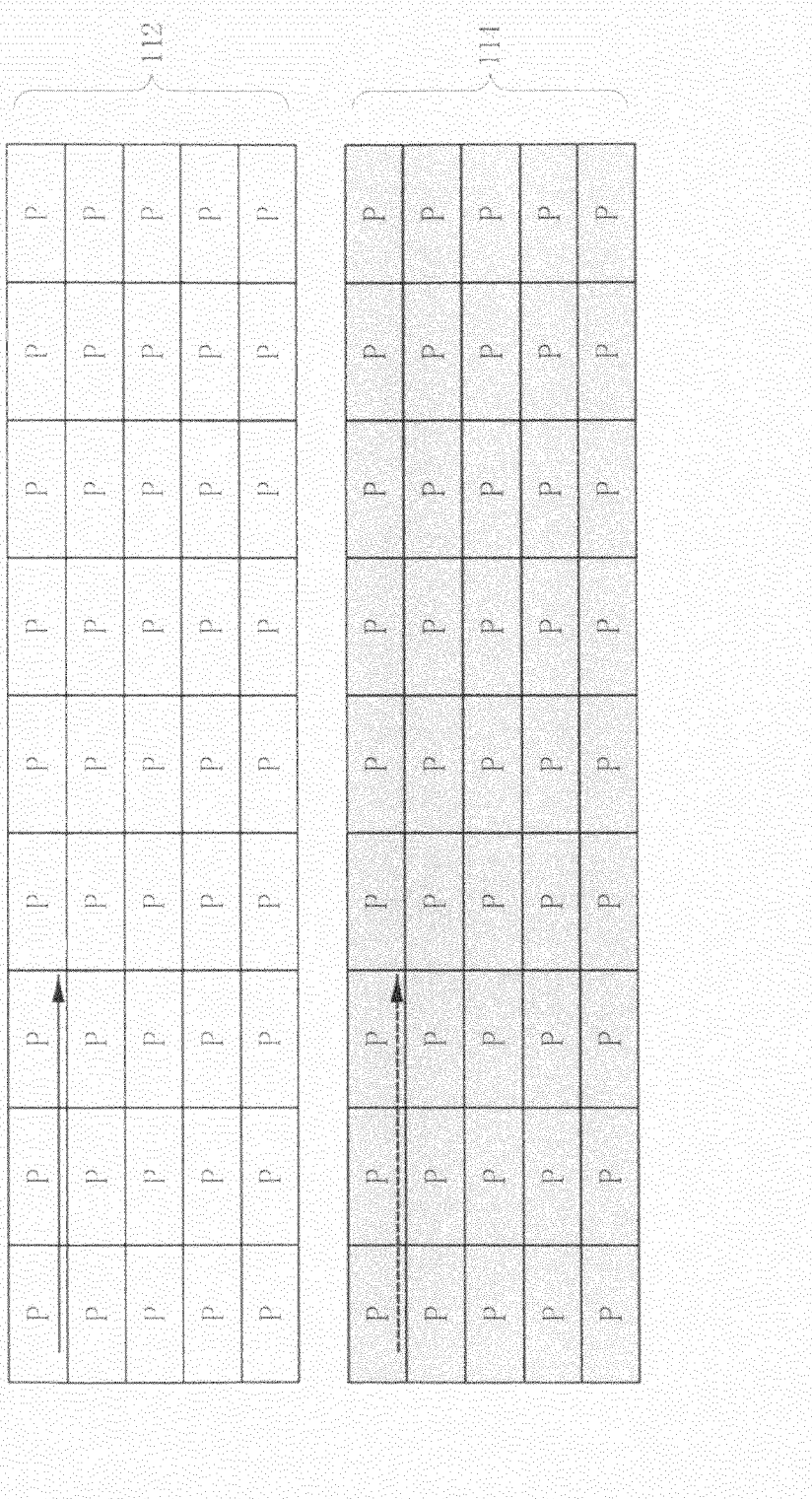

FIGS. 6 to 8 are tables for test operation. A mount test operation of a semiconductor memory device according to example embodiments may be described as follows, referring to the tables of FIGS. 6 to 8 with the description of FIGS. 2 to 5.

As an example, memory block 114 may be initially selected as an output memory block.

FIG. 6 is a table illustrating an example test operation where pass signals P may be generated for all test results.

As shown in FIG. 6, when the pass signals P are generated in all tests of first and second memory blocks 112 and 114, the output of data BD from the second memory block 114 may be used to determine whether or not a fail has occurred. At this time, the second memory block 114 may be maintained as the output memory block without changing.

As described above, even when all the pass signals P are generated, the flag signal may be actually generated in error by unknown data or data of another area in the system having a mounted state. Even in this case, a fail or fail area may be detected through output data of the second memory block 114. For example, a fail or fail area may be detected by comparing data BD to an expected data value. For example, even if a pass signal P is generated, a difference between data BD from block 114 and the expected data value may indicate the existence of a fail or fail area associated with at least block 114.

FIG. 7 is a table representing a fail occurrence at a specific area 112a of first memory block 112.

As shown in FIG. 7, when fail occurs at a specific area 112a of the first memory block 112, the comparison unit 120 may generate a fail signal F. At this time, the output memory block may be the second memory block 114, thus it may be determined that the second memory block 114 is not the cause of the failure through data of the second memory block 114. For example, data BD output from block 114 may be compared to an expected data value. The data BD may be equal to the expected data value which may indicate that memory bock 114 is not the cause of the failure. In subsequently applying an active signal, the output memory block may be changed to first memory block 112 by the fail signal F. Thus, in the test of next cycle, a fail and fail area 112a may be detected through output data AD of the first memory block 112. For example, data AD associated with area 112a from block 112 may be compared to an expected data value. The data AD may be different from the expected data value which may indicate that at least area 112a may be a fail area.

FIG. 8 is a table for a fail occurrence at a specific area 114a of the second memory block 114.

As shown in FIG. 8, when a fail occurs at a specific area 114a of the second memory block 114, a fail signal F may be generated in the comparison unit 120. At this time, the output memory block may be the second memory block 114. Whether or not the fail occurred in the second memory block 114 may be determined through data of the second memory block 114, and the fail occurrence area 114a may be detected. For example, data BD associated with area 114a from block 114 may be compared to an expected data value. The data BD may be different from the expected data value which may indicate that at least area 114a may be a fail area.

As described above, according to example embodiments, at least two memory blocks may be tested simultaneously, thereby reducing a test time. In addition, the test is valid even in a mount environment and a test error may be reduced.

It will be apparent to those skilled in the art that modifications and variations may be made to example embodiments without deviating from the spirit or scope of example embodiments. Thus, it is intended that example embodiments cover any such modifications and variations of example embodiments provided they come within the scope of the appended claims and their equivalents. Accordingly, these and other changes and modifications are seen to be within the true spirit and scope of example embodiments as defined by the appended claims.

In the drawings and specification, example embodiments have been disclosed and, although specific terms are employed, they are used in a generic and descriptive sense only and not for purposes of limitation, the scope of example embodiments being set forth in the following claims.

What is claimed is:

1. A test circuit for use in a semiconductor memory device including a plurality of memory blocks, the circuit comprising:
   a comparison unit configured to compare test data of at least two test memory blocks, the test memory blocks being selected from among the plurality of memory blocks, configured to decide whether the test data of the test memory blocks are identical, and configured to output a pass signal or fail signal; and
   an output selection unit configured to select one of the test memory blocks as an output memory block, and change the output memory block to a different one of the test memory blocks if the fail signal is generated from the comparison unit, the output selection unit being configured to output test data of the output memory block through a data output path of the output selection unit.

2. The circuit of claim 1, wherein if the pass signal is applied from the comparison unit, the output selection unit maintains the output memory block without changing, outputting the data of the output memory block through the data output path.

3. The circuit of claim 2, the circuit being configured to write the test data being compared to at least two test memory blocks simultaneously.

4. The circuit of claim 2, wherein the plurality of memory blocks includes at least a first memory block and a second memory block, the first memory block and the second memory block being different from one another.

5. The circuit of claim 4, wherein the comparison unit is configured to compare first data as test data of the first memory block with second data as test data of the second memory block, generate a pass signal if the first and second data are identical, and generate a fail signal if the first and second data are different from each other.

6. The circuit of claim 5, wherein the comparison unit comprises at least one XOR logic circuit and one OR logic circuit.

7. A test circuit for use in a semiconductor memory device including a plurality of memory blocks, the circuit comprising:
   a comparison unit configured to compare test data of at least two test memory blocks, the test memory blocks being selected from among the plurality of memory blocks, configured to decide whether the test data of the test memory blocks are identical, and configured to output a pass signal or fail signal; and
   an output selection unit configured to select one of the test memory blocks as an output memory block, and change the output memory block to a different one of the test memory blocks if the fail signal is generated from the comparison unit, the output selection unit being configured to output test data of the output memory block through a data output path of the output selection unit,
   wherein the output selection unit is configured such that if the pass signal is applied from the comparison unit, the output selection unit maintains the output memory block without changing, outputting the data of the output memory block through the data output path, the test circuit being configured to write the test data being compared to at least two test memory blocks simultaneously, wherein the plurality of memory blocks includes at least a first memory block and a second memory block, the first memory block and the second memory block being different from one another, wherein the comparison unit is configured to compare first data as test data of the first memory block with second data as test data of the second memory block, generate a pass signal if the first and second data are identical, and generate a fail signal if the first and second data are different from each other, and wherein the output selecting unit is configured to alternately select output data from the first and second data if the fail signal is generated by the comparison unit.

8. The circuit of claim 7, wherein the semiconductor memory device comprises a memory module mounted on a PCB.

9. The circuit of claim 2, wherein the test circuit further comprises a selection signal generating unit for generating a selection signal to select the output memory block through the output selection unit.

10. The circuit of claim 9, wherein the selection signal generating unit is configured to generate a selection signal to change the output memory block in response to the fail signal and a subsequent active signal of the comparison unit.

11. A semiconductor memory device comprising:
a memory cell array having at least first and second memory blocks, the first and second memory blocks being different from each other; and
a test circuit including
a comparison unit configured to compare test data of at least two test memory blocks, the test memory blocks being selected from among the plurality of memory blocks, configured to decide whether the test data of the test memory blocks are identical, and configured to output a pass signal or fail signal; and
an output selection unit configured to select one of the test memory blocks as an output memory block, and change the output memory block if the fail signal is generated from the comparison unit, the output selection unit being configured to output test data of the output memory block through a data output path, wherein
the plurality of memory blocks includes at least the first and second memory blocks, the test memory blocks are the first and second memory blocks, the output selection unit is configured to alternate between selecting the first memory block and the second memory block as the output memory block if the fail signal is generated.

12. The device of claim 11, wherein the semiconductor memory device further comprises a selection signal generating unit for generating a selection signal to select the output memory block through the output selection unit.

13. The device of claim 12, wherein the selection signal generating unit is configured to generate a selection signal to alternately select the output memory block in response to a pass signal and a subsequent active signal of the comparison unit.

14. A mount test method for use in a semiconductor memory device, comprising:
selecting different output memory blocks from a plurality of memory blocks according to whether or not test data of memory blocks previously selected from the plurality of memory blocks are identical, and outputting the test data;
choosing at least two test memory blocks, the test memory blocks being chosen from the plurality of memory blocks, comparing test data of the test memory blocks, deciding whether or not the data of the test memory blocks are identical, and outputting a pass signal or fail signal; and
selecting an output memory block from among the test memory blocks for outputting test data through a data output path by maintaining the output memory block when a pass signal is generated and changing the output memory block when a fail signal is generated.

15. The method of claim 14, wherein the pass signal is generated when test data of the test memory blocks are identical to each other, and the fail signal is generated when the test data are not identical.

16. The method of claim 15, wherein the output memory block is selected in response to a selection signal, and the selection signal is generated in response to the fail signal.

17. A mount test method for use in a semiconductor memory device, comprising:
selecting different output memory blocks from a plurality of memory blocks according to whether or not test data of memory blocks previously selected from the plurality of memory blocks are identical, and outputting the test data;
choosing at least two test memory blocks, the test memory blocks being chosen from the plurality of memory blocks, comparing test data of the test memory blocks, deciding whether or not the data of the test memory blocks are identical, and outputting a pass signal or fail signal; and
selecting an output memory block from among the test memory blocks for outputting test data through a data output path by maintaining the output memory block when a pass signal is generated and changing the output memory block when a fail signal is generated,
wherein the pass signal is generated when test data of the test memory blocks are identical to each other, and the fail signal is generated when the test data are not identical,
wherein the output memory block is selected in response to a selection signal, and the selection signal is generated in response to the fail signal, and
wherein the selection signal is generated at a time point when a subsequent active signal is generated.

18. The method of claim 15, wherein the test method is performed on a semiconductor memory device comprising a memory module mounted on a PCB.

* * * * *